(12) United States Patent
Hudson et al.

(10) Patent No.: US 8,518,209 B2
(45) Date of Patent: Aug. 27, 2013

(54) APPARATUS FOR DETERMINING THE ENDPOINT OF A CLEANING OR CONDITIONING PROCESS IN A PLASMA PROCESSING SYSTEM

(75) Inventors: Eric Hudson, Berkeley, CA (US); Douglas Keil, Fremont, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 136 days.

(21) Appl. No.: 12/504,833

(22) Filed: Jul. 17, 2009

(65) Prior Publication Data

US 2009/0277584 A1    Nov. 12, 2009

Related U.S. Application Data

(62) Division of application No. 11/092,737, filed on Mar. 28, 2005, now Pat. No. 7,578,301.

(51) Int. Cl.
| | |
|---|---|
| H01L 21/3065 | (2006.01) |
| C23C 16/52 | (2006.01) |
| C23C 16/50 | (2006.01) |
| H05H 1/24 | (2006.01) |
| H05H 1/00 | (2006.01) |
| B08B 9/00 | (2006.01) |

(52) U.S. Cl.
USPC ............ 156/345.25; 156/345.24; 156/345.43; 156/345.47; 156/345.48; 118/665; 118/712; 118/723 R; 118/723 E; 118/723 I; 134/1.1; 134/22.1

(58) Field of Classification Search
USPC ............. 156/345.25, 345.28, 345.24, 345.43, 156/345.47, 345.48; 118/712, 665, 723 R, 118/723 E, 723 I; 134/1.1, 22.1
See application file for complete search history.

(56) References Cited

U.S. PATENT DOCUMENTS 5,664,066 A * 9/1997 Sun et al. ................. 706/25
5,751,018 A   5/1998 Alivisatos et al.
(Continued)

FOREIGN PATENT DOCUMENTS

| EP | 0792571 B1 | 9/1996 |
| FR | 2738984 A1 | 9/1995 |

(Continued)

OTHER PUBLICATIONS

"Non Final Office Action", U.S. Appl. No. 11/092,737, Mailing Date: May 2, 2007.

(Continued)

*Primary Examiner* — Jeffrie R Lund
(74) *Attorney, Agent, or Firm* — Schwegman Lundberg & Woessner, P.A.

(57) ABSTRACT

An apparatus for determining an endpoint of a process by measuring a thickness of a layer is provided. The layer is disposed on the surface by a prior process. The apparatus includes means for providing a sensor that is coplanar with the surface, wherein the sensor is configured to measure the thickness. The apparatus also includes means for exposing the plasma chamber to a plasma, wherein the thickness is changed by the exposing, and means for determining the thickness as a function of time. The apparatus further includes means for ascertaining a steady state condition in the thickness, the steady state condition being characterized by a substantially stable measurement of the thickness, a start of the steady state condition representing the endpoint.

17 Claims, 8 Drawing Sheets

(56) References Cited

U.S. PATENT DOCUMENTS

| | | | |
|---|---|---|---|
| 5,812,403 A | | 9/1998 | Fong et al. |
| 5,936,413 A | * | 8/1999 | Booth et al. ............... 324/678 |
| 6,228,278 B1 | * | 5/2001 | Winniczek et al. ........... 216/61 |
| 6,368,678 B1 | | 4/2002 | Bluck et al. |
| 6,376,262 B1 | | 4/2002 | Kempa et al. |
| 7,319,316 B2 | * | 1/2008 | Kimball et al. ............ 324/76.76 |
| 7,465,673 B2 | * | 12/2008 | Igarashi et al. ............... 438/725 |
| 7,479,207 B2 | * | 1/2009 | Kimball et al. ........... 156/345.24 |
| 7,578,301 B2 | | 8/2009 | Hudson et al. |
| 7,723,994 B2 | * | 5/2010 | Kimball et al. .............. 324/464 |
| 2001/0025691 A1 | * | 10/2001 | Kanno et al. ................. 156/345 |
| 2002/0025388 A1 | | 2/2002 | Bhardwaj et al. |
| 2003/0032278 A1 | | 2/2003 | Chen et al. |
| 2004/0011379 A1 | * | 1/2004 | Anaokar et al. ............... 134/1.1 |
| 2004/0040658 A1 | | 3/2004 | Usui et al. |
| 2004/0109938 A1 | | 6/2004 | Liu et al. |
| 2004/0129385 A1 | | 7/2004 | Wise et al. |
| 2004/0149384 A1 | * | 8/2004 | Kanno et al. ............ 156/345.24 |
| 2004/0185380 A1 | * | 9/2004 | Igarashi et al. ............... 430/313 |
| 2005/0142891 A1 | * | 6/2005 | Tai et al. ....................... 438/767 |
| 2006/0216406 A1 | | 9/2006 | Hudson et al. |
| 2007/0000843 A1 | * | 1/2007 | Kimball et al. ............... 210/745 |
| 2007/0215285 A1 | * | 9/2007 | Kimball et al. ........... 156/345.48 |
| 2008/0066861 A1 | * | 3/2008 | Kimball et al. ............. 156/345.1 |
| 2009/0133836 A1 | * | 5/2009 | Kimball et al. ........... 156/345.28 |
| 2009/0277584 A1 | * | 11/2009 | Hudson et al. ............ 156/345.25 |
| 2010/0229372 A1 | * | 9/2010 | Kimball et al. ............... 29/592.1 |
| 2010/0270262 A1 | * | 10/2010 | Hanawa et al. ................. 216/13 |
| 2010/0289510 A1 | * | 11/2010 | Pingree et al. ................ 324/693 |

FOREIGN PATENT DOCUMENTS

| | | |
|---|---|---|
| JP | 10-233391 | 9/1998 |
| JP | 2004-79609 | 3/2001 |
| JP | 2001-338917 | 12/2001 |
| JP | 2002-57149 | 2/2002 |
| JP | 2002151417 A | 5/2002 |
| JP | 2002-246320 | 8/2002 |
| WO | WO-9711587 A1 | 3/1997 |

OTHER PUBLICATIONS

"International Search Report", Issued in International Application No. PCT/US2006/10576, Mailing Date: Oct. 29, 2007.

"Written Opinion", Issued in international Application No. PCT/US2006/10576, Mailing Date: Oct. 29, 2007.

"International Preliminary Report on Patentability", Issued in International Application No. PCT/US2006/10576, Mailing Date: Nov. 29, 2007.

"Non Final Office Action", U.S. Appl. No. 11/092,737, Mailing Date: Dec. 10, 2007.

Braithwaite et al., "Transient RF Self-Bias in Electropositive and Electronegative Plasmas", J. Physics D: Applied Physics. 36, Oct. 30, 2003, ACT. Australia, pp. 2837-2844, http://stacks.iop.org/jd/36/2837.

Stanford Research Systems, "Quartz-Crystal Microbalance-QCM200", Stanford Research Systems, http://www.thinkSRS.com/products/QCM200.htm, Jan. 23, 2005, Sunnyvale, CA, pp. 1-4.

Booth, Jean-Paul "Diagnostics of Etching Plasmas", Pure Appl. Chem., vol. 74 No. 3, 2002, Palaiseau, France, pp. 397-400.

Braithwaite et al., "A Novel Electrostatic Probe Method for Ion Flux Measurements", Plasma Sources Sci. Technol. 5, Sep. 3, 1996, Milton Keynes, UK, pp. 677-684.

Stanford Reasearch Systems, "Quartz Crystal microbalance-QCM100 and QCM200- 5MHz", Stanford Research Systems, www.thinkSRS.com, Aug. 6, 2005, Sunnyvale, CA, pp. 1-4.

Booth et al., "Measurements of Characteristic Transients of Planar Electrostatic Probes in Cold Plasmas", Review of Scientific Instruments, vol. 71, No. 7, Jul. 2000, Oxford, UK, p, 2722-2727.

"Final Office Action", U.S. Appl. No. 11/092,737, Mailing Date: May 30, 2008.

"Non Final Office Action", U.S. Appl. No. 11/092,737, Mailing Date: Nov. 13, 2008.

Murete De Castro et al., "End Point Detection of Polymer Etching Using Langmuir Probes", IEEE Transaction on Plasma Science, vol. 28, No. 3, Jun. 2000, pp. 1043-1049.

"Final Office Action", U.S. Appl. No. 11/092,737, Mailing Date: Mar. 16, 2009.

"Third Office Action", Issued in Chinese Application No. 200680010072.8; Mailing Date: May 17, 2010.

"Notification on Reasons of Refusal", Japanese Patent Application No. 2008-504173, Mailing Date: Aug. 30, 2011.

"U.S. Appl. No. 11/092,737, Advisory Action mailed Aug. 6, 2008", 3 pgs.

"U.S. Appl. No. 11/092,737, Non Final Office Action mailed Dec. 10, 2009", 8 pgs.

"U.S. Appl. No. 11/092,737, Notice of Allowance mailed Apr. 24, 2009", 7 pgs.

"U.S. Appl. No. 11/092,737, Response filed Feb. 12, 2009 to Non Final Office Action mailed Nov. 13, 2008", 8 pgs.

"U.S. Appl. No. 11/092,737, Response filed Jul. 16, 2009 to Notice of Allowance", 2 pgs.

"U.S. Appl. No. 11/092,737, Response filed Jul. 30, 2008 to Final Office Action mailed May 30, 2008", 9 pgs.

"U.S. Appl. No. 11/092,737, Response filed Aug. 28, 2008 to Final Office Action mailed May 30, 2008", 9 pgs.

"U.S. Appl. No. 11/092,737, Response filed Nov. 13, 2007 to Restriction Requirement mailed Oct. 10, 2007", 2 pgs.

"U.S. Appl. No. 11/092,737, Restriction Requirement mailed May 2, 2007", 4 pgs.

"U.S. Appl. No. 11/092,737, Restriction Requirement mailed Oct. 10, 2007", 5 pgs.

"Japanese Application Serial No. 2008-504173, Notice on Reasons of Refusal mailed May 29, 2012", 2 pgs.

* cited by examiner

APPARATUS FOR DETERMINING THE ENDPOINT OF A CLEANING OR CONDITIONING PROCESS IN A PLASMA PROCESSING SYSTEM

PRIORITY CLAIM

This divisional application claims priority under 37 CFR 1.53(b) of and claims the benefit under 35 U.S.C. §120 to a commonly assigned patent application entitled "Methods and Apparatus for Determining The Endpoint of a Cleaning or Conditioning Process in a Plasma Processing System," by Hudson et al., Application Ser. No. 11/092,737 filed on Mar. 28, 2005, now U.S. Pat. No. 7,578,301 all of which is incorporated herein by reference.

BACKGROUND OF THE INVENTION

The present invention relates in general to substrate manufacturing technologies and in particular to methods and apparatus for determining the endpoint of a cleaning or conditioning process in a plasma processing system.

In the processing of a substrate, e.g., a semiconductor wafer, MEMS device, or a glass panel such as one used in flat panel display manufacturing, plasma is often employed. As part of the processing of a substrate (chemical vapor deposition, plasma enhanced chemical vapor deposition, physical vapor deposition, etch, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$. etc.) are then flowed into the chamber and struck to form a plasma to etch exposed areas of the substrate.

To ensure consistent plasma processing results, it is common practice to employ chamber conditioning processes prior to processing for every substrate. Chamber conditioning generally refers to a process that sets or resets the plasma chamber conditions to a substantially known state. For example, it is routine practice on dielectric etch plasma processing systems to remove residual hydrofluorocarbon polymers from the plasma chamber surfaces prior to processing the next substrate (i.e., without a substrate present), in a process known as waferless auto clean or WAC. WAC is commonly performed after a substrate has been processed, to ensure that the next substrate sees a standard, well-defined chamber condition, avoiding cumulative effects of pollutant byproduct buildup.

Generally comprised of organic and inorganic byproducts, pollutants are generated by the plasma process from materials in the etchant gases (e.g., carbon, fluorine, hydrogen, nitrogen, oxygen, argon, xenon, silicon, boron, chlorine, etc.), from materials in the substrate (e.g. photoresist, silicon, oxygen, nitrogen, aluminum, titanium, etc.), or from structural materials within the plasma processing chamber itself (e.g., aluminum, quartz, etc.).

Consistent plasma processing results may also be enhanced by be pre-coating the plasma chamber surfaces with a well-defined plasma-deposited film prior to processing each substrate to ensure a standard, well-defined chamber condition. Useful to avoid buildup of undesirable materials on chamber surfaces during the substrate processing, this method may reduce the time needed to recover from wet chamber cleans.

Conditioning the plasma chamber also may allow the surface chemistry of some plasma chamber materials to be more precisely controlled, such as the removal of oxidized surface films before processing each substrate. For example, Si tends to form a surface oxide when exposed to oxygen plasma. The presence of surface oxide as opposed to bare Si may have a significant influence on process results due to the well-known large variation in radical recombination rates on insulating as opposed to conductive surfaces. In addition, some plasma chamber conditioning processes may also require use of a dummy substrate that does not include microscopic structures, in order to protect the electrostatic chuck (chuck).

In these processes and others, it is important to determine when the endpoint of the process is reached. Endpoint generally refers to a set of values, or a range, in a plasma process (e.g., time) for which a process is considered complete. For conditioning, pre-coating, and surface chemistry control applications, the thickness of the material of interest is usually the most important value.

Figure 1:
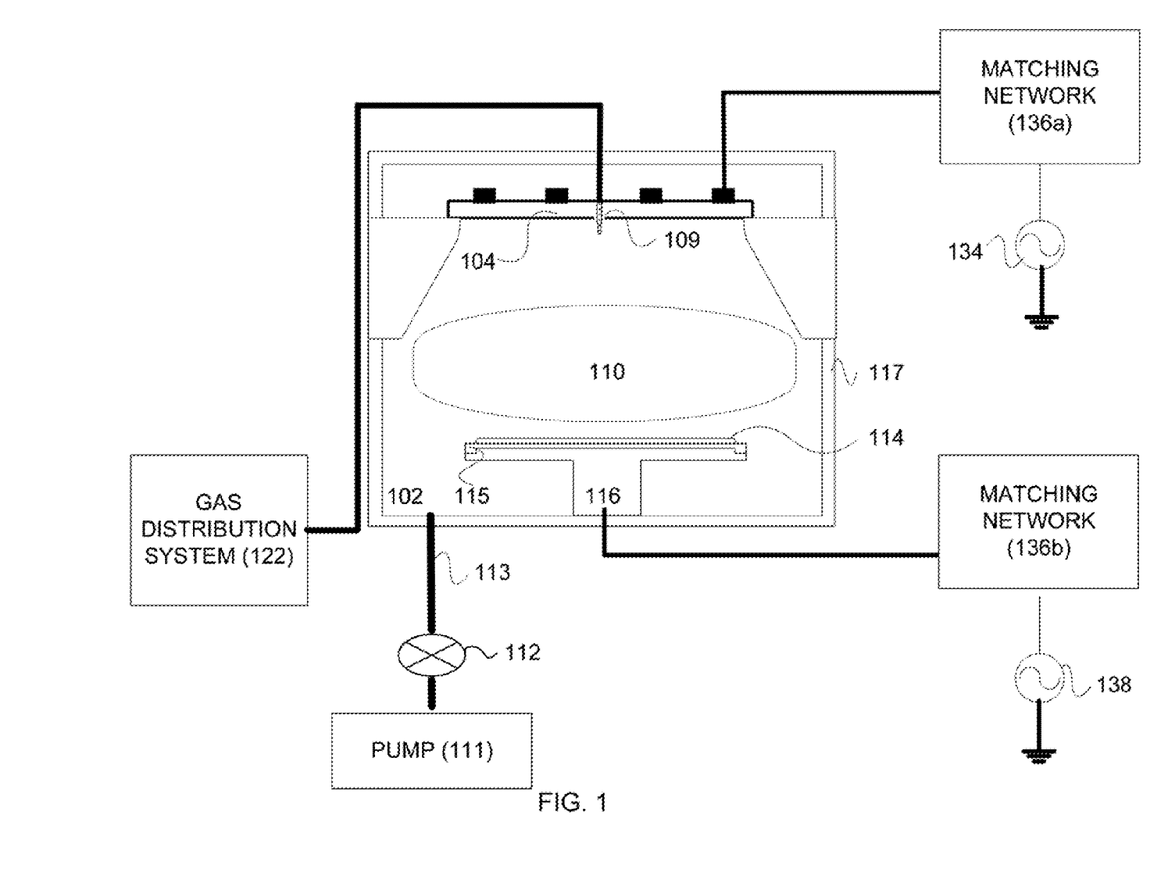
FIG. 1 illustrates a simplified diagram of an inductively coupled plasma processing system.

Referring now to FIG. 1, a simplified diagram of an inductively coupled plasma processing system is shown. Generally, an appropriate set of gases may be flowed from gas distribution system 122 into plasma chamber 102 having plasma chamber walls 117. These plasma processing gases may be subsequently ionized at or in a region near injector 109 to form a plasma 110 in order to process (e.g., etch or deposit) exposed areas of substrate 114, such as a semiconductor substrate or a glass pane, positioned with edge ring 115 on an electrostatic chuck 116.

A first RF generator 134 generates the plasma as well as controls the plasma density, while a second RF generator 138 generates bias RF, commonly used to control the DC bias and the ion bombardment energy. Further coupled to source RF generator 134 is matching network 136a, and to bias RF generator 138 is matching network 136b, that attempt to match the impedances of the RF power sources to that of plasma 110. Furthermore, vacuum system 113, including a valve 112 and a set of pumps 111, is commonly used to evacuate the ambient atmosphere from plasma chamber 102 in order to achieve the required pressure to sustain plasma 110 and/or to remove process byproducts.

Figure 2:
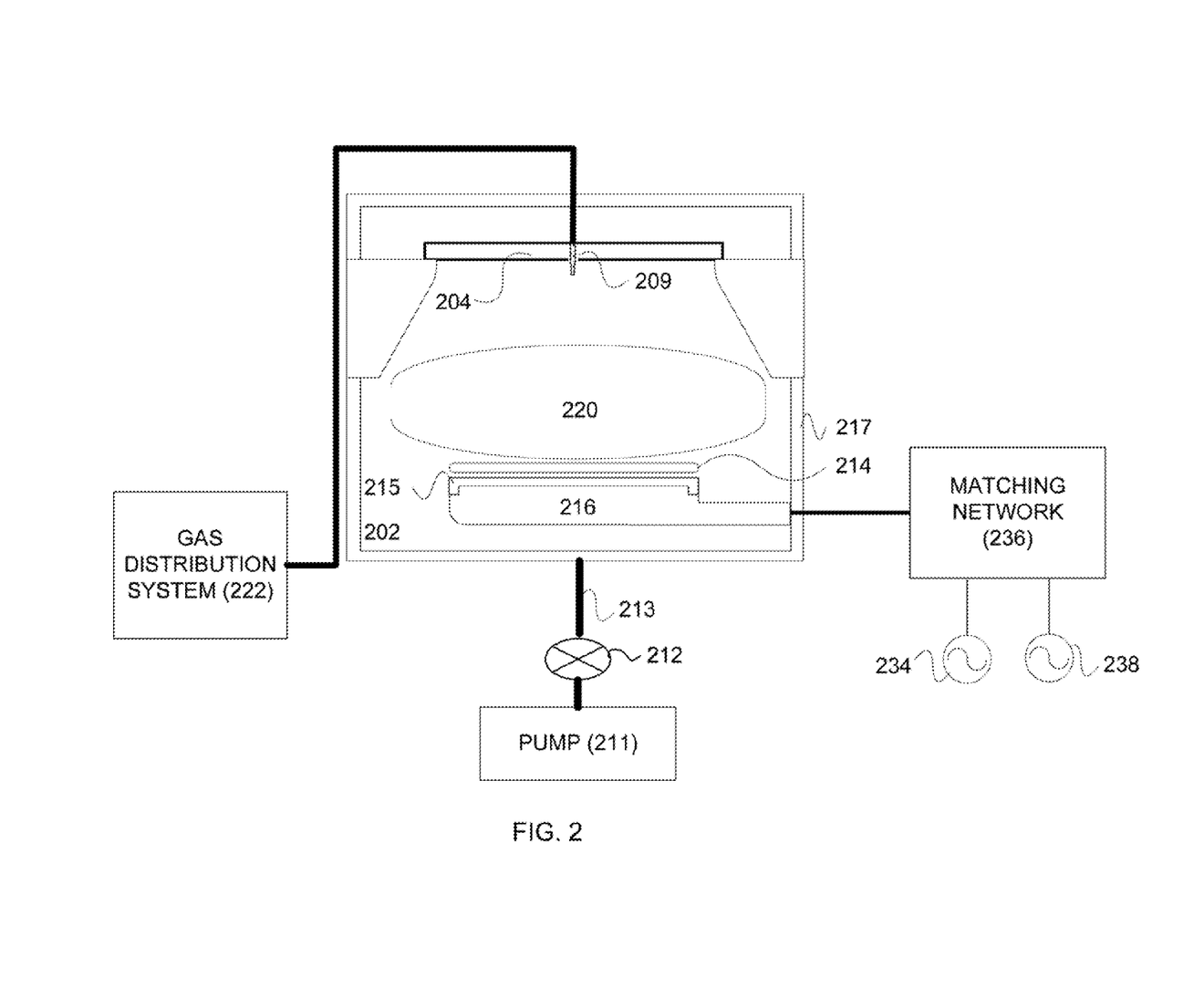
FIG. 2 illustrates a simplified diagram of a capacitively coupled plasma processing system.

Referring now to FIG. 2, a simplified diagram of a capacitively coupled plasma processing system is shown. Generally, capacitively coupled plasma processing systems may be configured with a single or with multiple separate RF power sources. Source RF, generated by source RF generator 234, is commonly used to generate the plasma as well as control the plasma density via capacitively coupling. Bias RF, generated by bias RF generator 238, is commonly used to control the DC bias and the ion bombardment energy. Further coupled to source RF generator 234 and bias RF generator 238 is matching network 236, which attempts to match the impedance of the RF power sources to that of plasma 220. Other forms of capacitive reactors have the RF power sources and match networks connected to the top electrode 204. In addition there are multi-anode systems such as a triode that also follow similar RF and electrode arrangements.

Generally, an appropriate set of gases is flowed through an inlet in a top electrode 204 from gas distribution system 222 into plasma chamber 202 having plasma chamber walls 217. These plasma processing gases may be subsequently ionized to form a plasma 220, in order to process (e.g., etch or deposit) exposed areas of substrate 214, such as a semiconductor substrate or a glass pane, positioned with edge ring 215 on an electrostatic chuck 216, which also serves as an electrode. Furthermore, vacuum system 213, including a valve 212 and a set of pumps 211, is commonly used to evacuate the ambient atmosphere from plasma chamber 202 in order to achieve the required pressure to sustain plasma 220.

In view of the foregoing, there are desired methods and apparatus for determining the endpoint of a cleaning or conditioning process in a plasma processing system.

SUMMARY OF THE INVENTION

The invention relates, in another embodiment, to an apparatus for determining an endpoint of a process by measuring a thickness of a layer, the layer being deposited on the surface by a prior process. The apparatus includes means for providing a sensor that is coplanar with the surface, wherein the sensor is configured to measure the thickness. The apparatus also includes means for exposing the plasma chamber to a plasma, wherein the thickness is changed by the exposing, and means for determining the thickness as a function of time. The apparatus further includes means for ascertaining a steady state condition in the thickness, the steady state condition being characterized by a substantially stable measurement of the thickness, a start of the steady state condition representing the endpoint.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that an endpoint of a process that can change the thickness of a layer on a plasma processing chamber surface may be determined with a sensor that is substantially coplanar with the plasma chamber surface or, alternatively, a sensor that is recessed into a plasma chamber wall.

Coplanar refers to the position of the sensor in relation to a plasma chamber surface, wherein a measuring surface of the sensor and the surface of the plasma chamber are substantially on the same plane. Recessed refers to the position of the sensor in relation to a plasma chamber surface, wherein the surface of the plasma chamber is between the measuring surface of the sensor and the plasma.

Unlike other indirect measurement techniques, such as the use of a non-coplanar or non-recessed interferometer which are subject to distortion, a coplanar or recessed sensor can directly measure the surface condition inside the plasma chamber. For example, in situations in which plasma chamber surfaces are pre-coated with a well-defined plasma-deposited film, it may be very difficult to use conventional sensors to determine the thickness of the deposited film, since the plasma condition during deposition is insensitive to the film thickness. Similarly, indirect sensors may be insensitive to changes in the surface oxidation state of the chamber materials.

In one embodiment, in a non-obvious way, a coplanar ion flux probe may be used to substantially detect the endpoint of a chamber conditioning process. In general, as RF energy is induced into the plasma chamber to sustain the plasma, an electric potential generally forms on the chamber surfaces from ions in the plasma. Subsequently, a capacitance is induced in the coplanar ion flux probe, which is also exposed to the plasma. As slow transient currents charge and discharge the capacitance, I-V characteristics of the ion flux probe may subsequently be determined.

Prior to the measurement the coplanar ion flux is biased negatively with respect to its steady floating potential by the application of a short burst of RF potential. The nonlinearity of the plasma sheath charges the capacitance. At the end of the RF burst, the probe potential returns to its original floating potential as the capacitance discharges, initially through the arrival of positive charge from the plasma.

However, the degree of induced capacitance may be affected by byproduct buildup. Since byproduct deposits tend to be comprised of large amounts of dielectric materials, they tend to partially insulate the underlying coplanar ion flux probe from the plasma, creating a smaller electric potential. That is, plasma chamber surfaces that are substantially clean may have a potential closer than that of the plasma, whereas ones with byproduct deposits generally have a potential that is less than the plasma. Eventually, the potential discharges and the chamber surfaces settle back to the normal dc floating potential. In general, a difference in potential, or the bias, is proportional to a change in the thickness of the byproduct deposits.

Figure 3:
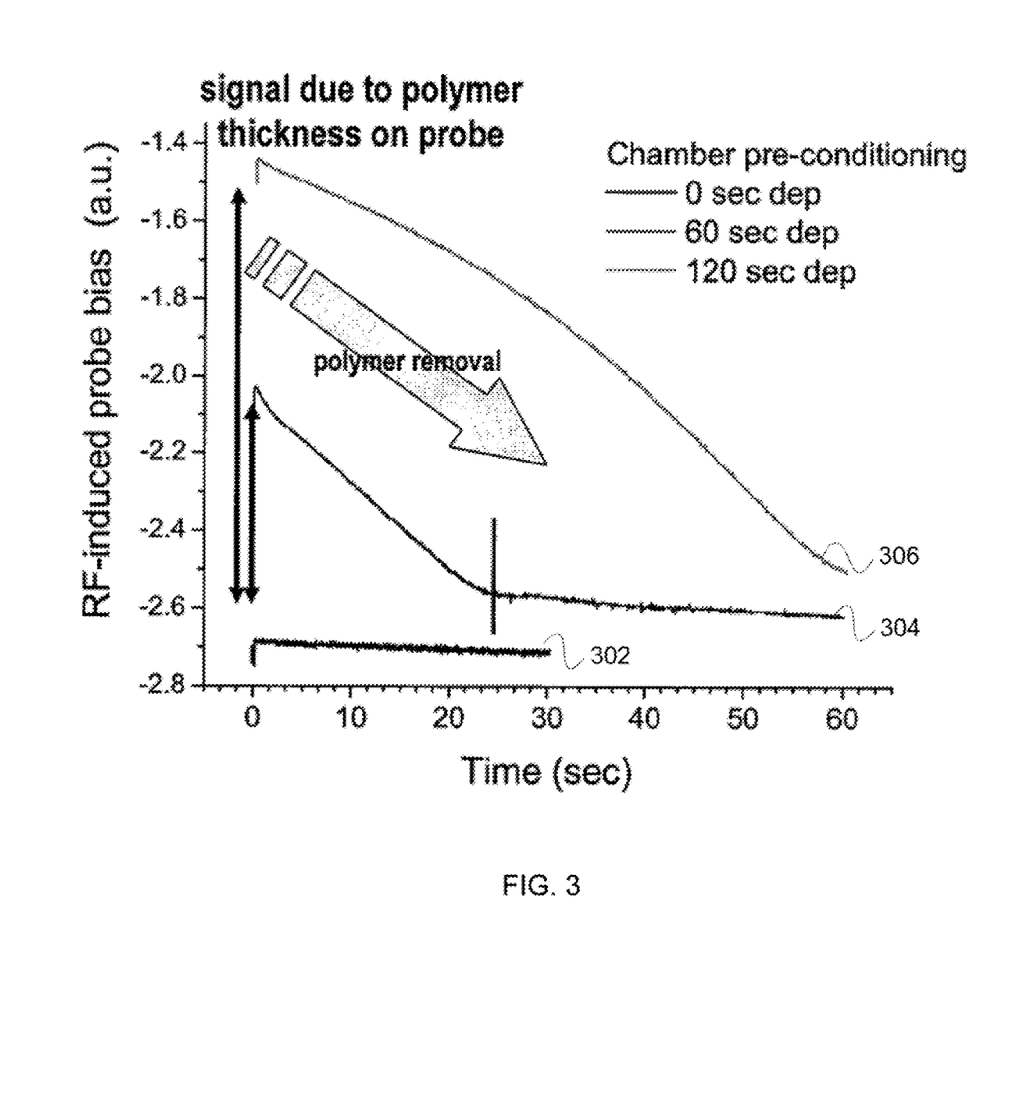
FIG. 3 illustrates an example from a dielectric etch plasma processing, where the induced bias on the probe during the pulsed application of RF power is correlated to the thickness of polymer deposited on the probe, according to one embodiment of the invention.

Referring now to FIG. 3, an example from a dielectric etch plasma processing system is shown, where the induced bias on the probe during the pulsed application of RF power is correlated to the thickness of polymer deposited on the probe. In this example, the polymer was pre-deposited, and then a cleaning-type recipe was used to remove the film. The probe data is collected at a high rate, allowing real-time measurement of polymer film removal. In this example, RF-induced probe bias in a.u. (atomic units), on the vertical axis, is plotted against time in seconds, on the horizontal axis. In general, an atomic unit is an arbitrarily defined unit of charge. A proton has a charge of +1 atomic units and an electron has a charge of −1 atomic units.

Plot 302 represents RF-induced probe bias as a function of time for a plasma chamber with no pre-conditioning. Since there is effectively no byproduct to partially insulate the coplanar ion flux probe, the RF-induced probe bias is substantially constant at about −2.7 a.u. (automic units). Plot 304 represents RF-induced probe bias as a function of time for a plasma chamber with a 60 second polymer pre-conditioning deposit. Unlike plot 302, the RF-induced probe bias is somewhat lower at about −2.0 a.u. at time 0 sec of the dielectric etch plasma processing, progressing higher to about −2.6 a.u. at about 25 sec, at which point it becomes substantially constant, and therefore endpoint has been substantially reached. Plot 306 represents RF-induced probe bias as a function of time for a plasma chamber with a 120 second polymer pre-conditioning deposit. Like plot 304, the RF-induced probe bias is somewhat lower than plot 302, at about −1.4 a.u. at time 0 sec of the dielectric etch plasma processing, progressing higher to about −2.5 a.u. at about 60 sec. Unlike 304, there is no point within the 60 sec window at which the plot becomes substantially constant. This implies that the process endpoint has still not been reached.

Figure 4:
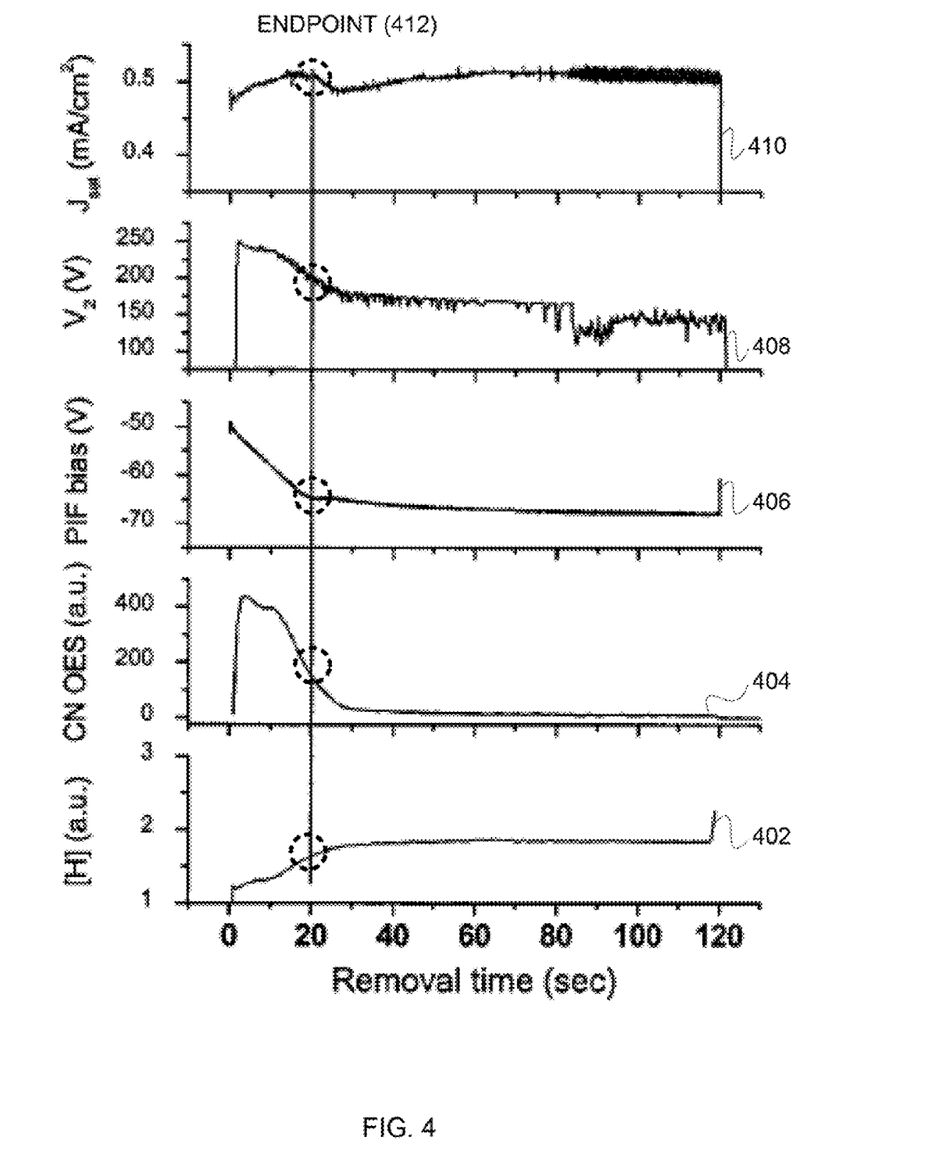
FIG. 4 illustrates a comparison of the probe data of FIG. 3 to other diagnostic data, in which probe induced bias is shown to be a substantially accurate method of detecting the correct endpoint for polymer removal, according to one embodiment of the invention.

Referring now to FIG. 4, a comparison of the probe data of FIG. 3 to other diagnostic data is shown, in which probe induced bias is shown to be a substantially accurate method of detecting the correct endpoint for polymer removal. This example demonstrates the use of the probe to endpoint the removal of polymer film from chamber surfaces. The data also shows how the probe could be used to endpoint the deposition of a dielectric film in the plasma chamber, for chamber conditioning purposes. For the data shown, the probe head was tungsten.

However, the probe may also use a doped silicon probe head, matched to the material used in a dielectric etch reactor. In that case, it is believed that the probe can detect thin surface oxides and could be used to detect the surface oxidation state of the silicon chamber parts, allowing the endpointing of chamber conditioning processes which either add or remove surface oxide from silicon.

Plot 402 represents hydrogen molecules in a.u. in the plasma chamber as a function of time. That is, as the surface oxide is etched, hydrogen is consumed in the etch process. Once the etching process is substantially finished, the amount of hydrogen in the plasma chamber stabilizes, as the amount added about equals the amount removed.

Plot 404 represents CN species also in a.u. in the plasma chamber as a function of time. That is, as the surface oxide is etched, CN is produced as a volatile byproduct in the etch process. Once the etching process is substantially finished, the amount of CN in the plasma is greatly reduced.

Plot 406 represents probe induced bias, as shown in FIG. 3, as a function of time. As previously described, the degree of induced capacitance is affected by byproduct buildup, which tends to insulate coplanar ion flux probe from the plasma. Subsequently, as the surface oxide is etched, the induced capacitance is increased. Once the etching process is substantially finished, the induced capacitance approaches that of the plasma itself and a substantially steady state condition is reached. At time 20 seconds, probe induced bias plot 406 becomes substantially constant at about −65 V, signaling that the surface oxide has been substantially etched. As can be seen, endpoint at time 20 seconds can also be detected in the remaining four plots.

Plot 408 represents voltage reactor at 2 MHz, as a function of time.

Plot 410 represents ion saturation current in mA/cm$^2$ as a function of time.

Figure 5:
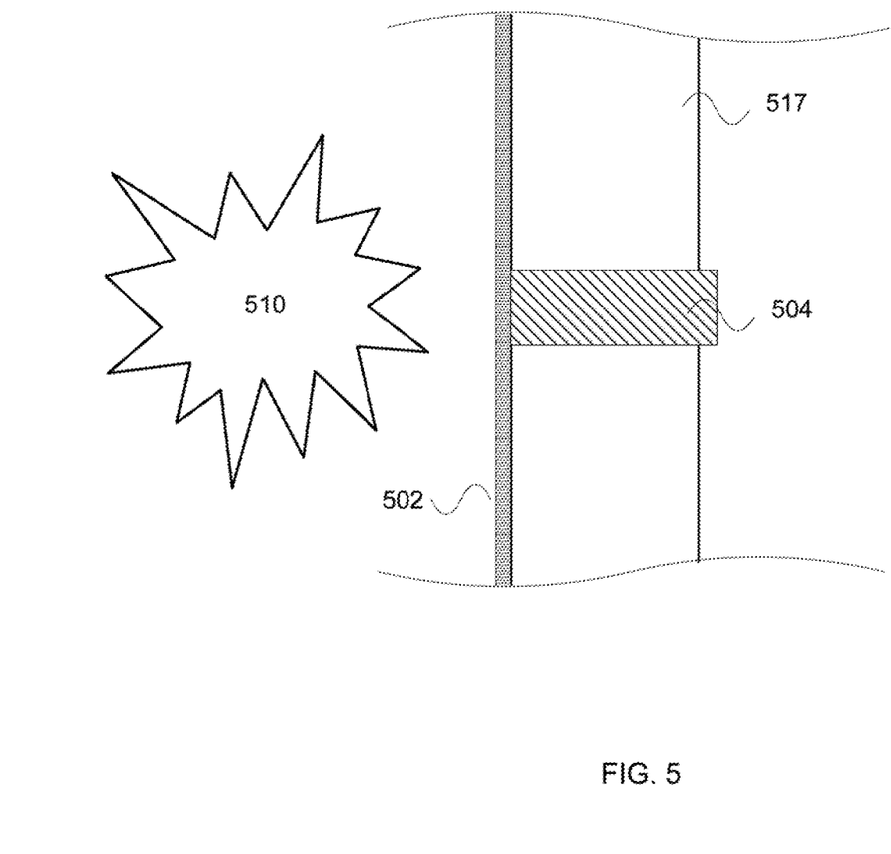
FIG. 5 illustrates a simplified diagram of a plasma chamber wall with a coplanar ion flux probe, according to one embodiment of the invention.

Referring now to FIG. 5, a simplified diagram of a plasma chamber wall with a coplanar ion flux probe is shown, according to one embodiment of the invention. Layer 502 represents a pre-conditioning plasma-deposited film or a pollutant byproduct buildup, and shields coplanar ion flux probe 504, which is positioned in plasma chamber wall 517, from direct exposure to plasma 510. As previously described, the degree of induced capacitance is affected by byproduct buildup, which tends to insulate coplanar ion flux probe from the plasma. Subsequently, as the surface oxide is etched, the induced capacitance is increased. Once the etching process is substantially finished, the induced capacitance approaches that of the plasma itself.

In another embodiment, a substantially coplanar quartz crystal microbalance (QCM) is used. In general, a QCM measures mass in processes occurring at or near surfaces, or within thin films, by measuring the resonant frequency and resistance of a 5 MHz, AT-cut quartz crystal. The resonant frequency changes as a linear function of the mass of material deposited on the crystal surface. The resistance at resonance changes with the elasticity of the material (film or liquid) in contact with the crystal surface. As gravimetric instruments, QCMs can measure mass ranging from micrograms to fractions of a nanogram. Detection limits correspond to sub-monolayers of atoms.

Figure 6:
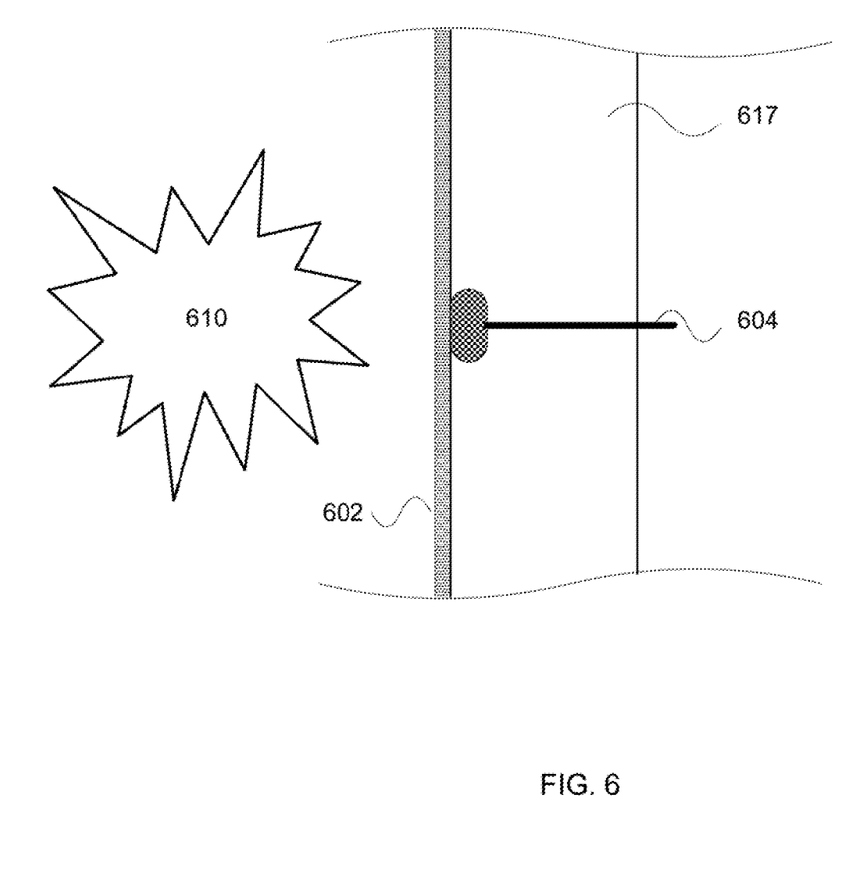
FIG. 6 illustrates a simplified diagram of a plasma chamber wall with a coplanar QCM, according to one embodiment of the invention.

Referring now to FIG. 6, a simplified diagram of a plasma chamber wall with a coplanar QCM is shown, according to one embodiment of the invention. Layer 602 represents a pre-conditioning plasma-deposited film or a pollutant byproduct buildup, and shields coplanar QCM 604, which is positioned in plasma chamber wall 617, from direct exposure to plasma 610. As previously described, coplanar QCM measures mass of layer 602, which is located proximate to it.

In another embodiment, an interferometer that is recessed into plasma chamber surface is used. In single-wavelength interferometry, a light beam may be directed on the surface of a polymer layer between the deposited polymer and the plasma chamber surface. The reflected signals then combine constructively or destructively to produce a periodic interference fringe. By measuring the number of fringes the thickness of material may be determined. Interferometry is generally accurate for features down to 0.25 microns.

Figure 7:
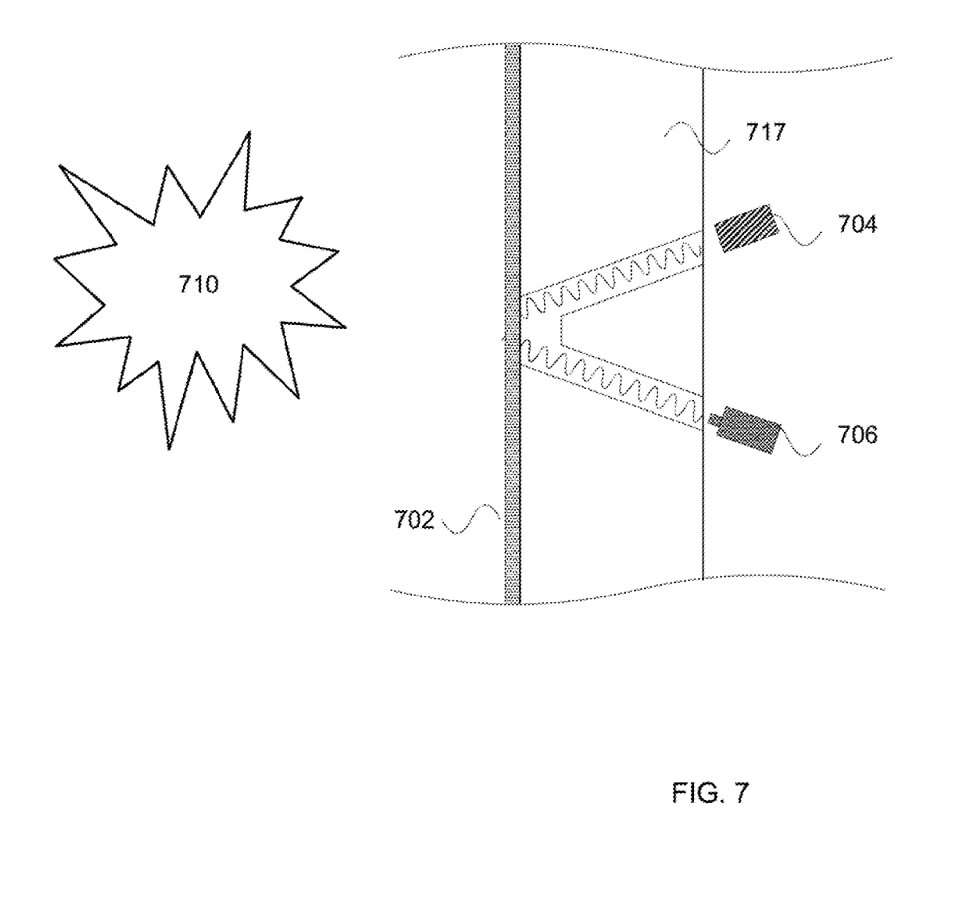
FIG. 7 illustrates a simplified diagram of a plasma chamber wall with a coplanar interferometer, according to one embodiment of the invention.

Referring now to FIG. 7, a simplified diagram of a plasma chamber wall with a coplanar interferometer is shown, according to one embodiment of the invention. Layer 702 represents a pre-conditioning plasma-deposited film or a pollutant byproduct buildup, and shields light beam source 704 and interferometer 706, which is positioned near plasma chamber wall 717, from direct exposure to plasma 710. As previously described, by measuring the number of fringes the thickness of the deposited polymer may be determined.

Figure 8:
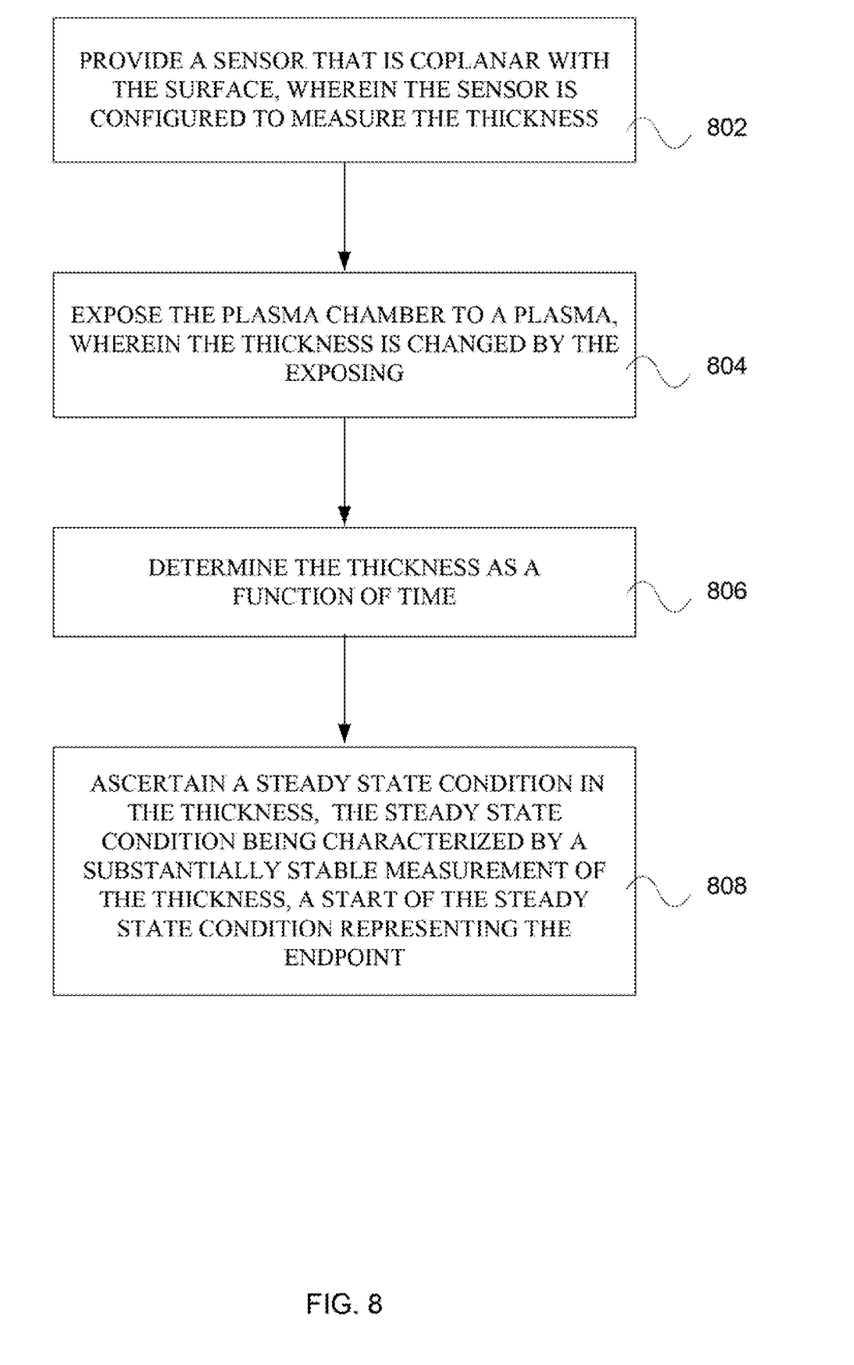
FIG. 8 illustrates a simplified method of determining an endpoint of a process by measuring a thickness of a layer, the layer being deposited on the surface by a prior process, according to one embodiment of the invention.

Referring now to FIG. 8, a simplified method of determining an endpoint of a process by measuring a thickness of a layer, the layer being deposited on the surface by a prior process, is shown, according to one embodiment of the invention. Initially, a sensor is provided that is coplanar with the surface, wherein the sensor is configured to measure the thickness, at step 802. Next, the plasma chamber is exposed to a plasma, wherein the thickness is changed by the exposing, at step 804. The thickness is then determined as a function of time, at step 806. Finally, a steady state condition in the thickness is ascertained, the steady state condition being characterized by a substantially stable measurement of the thickness, a start of the steady state condition representing the endpoint, at step 808.

While this invention has been described in terms of several preferred embodiments, there are alterations, permutations, and equivalents which fall within the scope of this invention. It should also be noted that there are many alternative ways of implementing the methods of the present invention.

Advantages of the invention include methods and apparatus for determining the endpoint of a cleaning or conditioning process in a plasma processing system. Additional advantages include optimizing process threshold detection, minimizing manufacturing yield problems, as well as optimizing plasma processing throughput.

Having disclosed exemplary embodiments and the best mode, modifications and variations may be made to the disclosed embodiments while remaining within the subject and spirit of the invention as defined by the following claims.

What is claimed is:

1. An apparatus for determining an endpoint of a chamber cleaning process performed for a plasma processing chamber by measuring a thickness of a layer in said plasma processing chamber, said chamber cleaning process including using a plasma, said plasma processing chamber including at least one chamber wall, said at least one chamber wall including at least one surface, said layer deposited on said at least one surface of said plasma processing chamber by a prior process, the apparatus comprising:
    a first sensor being coplanar with said at least one surface such that a measuring surface of said first sensor and said at least one surface of said plasma processing chamber are substantially on a same plane, wherein said first sensor is configured to measure said thickness, wherein said first sensor is a coplanar ion flux probe;
    a second sensor configured to measure an amount of CN species in said plasma processing chamber;
    a third sensor configured to measure an amount of hydrogen molecules in said plasma processing chamber;
    means for generating said plasma in said plasma processing chamber, wherein said thickness is changed by said generating;
    means for pulsing an RF burst to generate a potential at a sensor head of said first sensor; and
    means for ascertaining said endpoint of said cleaning process by:
        determining a steady state condition in at least one of a voltage or a current measured using said first sensor, a start of said steady state condition representing said endpoint;
        determining that said endpoint has been reached when said amount of said CN species measured by said second sensor has been reduced to a predetermined level; and
        determining that said endpoint has been reached when said amount of hydrogen molecules measured by said third sensor has stabilized.

2. The apparatus of claim 1, wherein said chamber cleaning process is a chamber pressure-conditioning process.

3. The apparatus of claim 1, wherein said chamber cleaning process is a waferless autoclean process.

4. The apparatus of claim 1, wherein said chamber cleaning process is a surface chemistry control process.

5. The apparatus of claim 1, wherein said means for generating said plasma in said plasma processing chamber includes inducing power into said plasma processing chamber to sustain said plasma.

6. The apparatus of claim 1, wherein said plasma generates ions that cause an electric potential to be formed on said at least one surface.

7. The apparatus of claim 1, wherein said first sensor is exposed to said plasma.

8. The apparatus of claim 1, wherein a capacitance of said first sensor is changed depending on said thickness of said layer.

9. The apparatus of claim 1, wherein said steady state condition represents a steady state condition in voltage.

10. The apparatus of claim 1, wherein said steady state condition represents a steady state condition in current.

11. An apparatus for determining an endpoint of a chamber cleaning process performed for a plasma processing chamber by measuring a thickness of a layer in said plasma processing chamber, said chamber cleaning process including using a plasma, said plasma processing chamber including at least one chamber wall, said at least one chamber wall including at least one surface, said layer deposited on said at least one surface of said plasma processing chamber by a prior process, the apparatus comprising:
    a coplanar ion flux probe being coplanar with said at least one surface such that a measuring surface of said coplanar ion flux probe and said at least one surface of said plasma processing chamber are substantially on a same plane;
    a second sensor configured to measure an amount of CN species in said plasma processing chamber;
    a third sensor configured to measure an amount of hydrogen molecules in said plasma processing chamber;
    means for generating said plasma in said plasma processing chamber;
    means for pulsing an RF burst to generate a potential at a sensor head of said coplanar ion flux probe; and
    means for ascertaining said endpoint of said cleaning process by:
        determining a steady state condition in at least one of a voltage or a current measured using said coplanar ion flux probe, a start of said steady state condition representing said endpoint;
        determining that said endpoint has been reached when said amount of said CN species measured by said second sensor has been reduced to a predetermined level; and
        determining that said endpoint has been reached when said amount of hydrogen molecules measured by said third sensor has stabilized.

12. The apparatus of claim 11, wherein said chamber cleaning process is a chamber pressure-conditioning process.

13. The apparatus of claim 11, wherein said chamber cleaning process is a waferless autoclean process.

14. The apparatus of claim 11, wherein said sensor head is formed of a material that includes tungsten.

15. The apparatus of claim 11, wherein said sensor head is formed of a material that includes doped silicon.

16. The apparatus of claim 11, wherein said layer represents a polymer layer.

17. The apparatus of claim 11, wherein said means for pulsing said RF burst negatively biases said coplanar ion flux probe with respect to its floating potential.

\* \* \* \* \*